US012683359B2

(12) United States Patent
Yang et al.

(10) Patent No.: US 12,683,359 B2
(45) Date of Patent: Jul. 14, 2026

(54) AUTOMATIC POWER CONTROL CIRCUIT AND METHOD, AND LASER DIODE CIRCUIT

(71) Applicant: Egis Technology Inc., Hsinchu City (TW)

(72) Inventors: Yu-Hsin Yang, Hsinchu City (TW); Chun-Yen Chiu, Hsinchu City (TW)

(73) Assignee: Egis Technology Inc., Hsinchu City (TW)

( * ) Notice: Subject to any disclaimer, the term of this patent is extended or adjusted under 35 U.S.C. 154(b) by 973 days.

(21) Appl. No.: 17/945,767

(22) Filed: Sep. 15, 2022

(65) Prior Publication Data

US 2023/0140910 A1 May 11, 2023

Related U.S. Application Data

(60) Provisional application No. 63/325,142, filed on Mar. 29, 2022, provisional application No. 63/276,667, filed on Nov. 8, 2021.

(30) Foreign Application Priority Data

Aug. 17, 2022 (CN) .......................... 202210988442.6

(51) Int. Cl.
*H01S 5/068* (2006.01)
*H01S 5/042* (2006.01)

(52) U.S. Cl.
CPC ........ *H01S 5/06808* (2013.01); *H01S 5/0428* (2013.01)

(58) Field of Classification Search
CPC .. H01S 5/0428; H01S 5/0617; H01S 5/06808; H01S 5/06835
See application file for complete search history.

(56) References Cited

U.S. PATENT DOCUMENTS 4,831,626 A * 5/1989 Watanabe ............. H01S 5/0683
 372/29.014
10,775,507 B2 9/2020 Mandai et al.
(Continued)

FOREIGN PATENT DOCUMENTS

CN 110289544 B 9/2020
TW I500280 B 9/2015
(Continued)

*Primary Examiner* — James A Menefee
(74) *Attorney, Agent, or Firm* — JCIPRNET

(57) ABSTRACT

The present disclosure provides an automatic power control circuit and method, and a laser diode circuit comprising the automatic power control circuit. The automatic power control circuit comprises: a voltage measurement unit configured to obtain an indicative voltage at a specific measurement point and output the indicative voltage to a processor, wherein the indicative voltage is configured to indicate a forward voltage of a laser diode in laser emitting state; and the processor configured to output a pulse parameter control signal in response to change in the indicative voltage, wherein the pulse parameter control signal is used to control an adjustment for a pulse parameter of laser pulses of the laser diode, such that laser emission power is within a preset range, and wherein the pulse parameter of the laser pulses of the laser diode is used to set a total duration of pulses within a preset time period.

21 Claims, 3 Drawing Sheets

(56)        References Cited

U.S. PATENT DOCUMENTS

| | | | | |
|---|---|---|---|---|
| 2004/0109482 | A1* | 6/2004 | Nakayama | H01S 5/042 |
| | | | | 372/38.02 |
| 2010/0158057 | A1* | 6/2010 | Lerner | H01S 5/06804 |
| | | | | 372/34 |
| 2015/0155686 | A1* | 6/2015 | Berkram | H01S 5/042 |
| | | | | 372/29.021 |
| 2020/0036157 | A1* | 1/2020 | Wolf | G01N 15/0205 |
| 2024/0266800 | A1* | 8/2024 | Arulandu | H01S 5/183 |
| 2024/0275130 | A1* | 8/2024 | Piskunov | H01S 5/06808 |

FOREIGN PATENT DOCUMENTS

| | | |
|---|---|---|
| TW | I560044 B | 12/2016 |
| TW | I667446 | 8/2019 |
| WO | 2021204816 | 10/2021 |

* cited by examiner

AUTOMATIC POWER CONTROL CIRCUIT AND METHOD, AND LASER DIODE CIRCUIT

CROSS-REFERENCE TO RELATED APPLICATIONS

The present application claims priority to Chinese Application No. 202210988442.6, filed Aug. 17, 2022, and to U.S. Provisional Application No. U.S. 63/276,667, filed on Nov. 8, 2021, and to U.S. Provisional Application No. 63/325, 142, filed on Mar. 29, 2022. All of the aforementioned applications are incorporated herein by reference in their entireties.

TECHNICAL FIELD

The present disclosure relates to the field of laser ranging, and in particular, to an automatic power control circuit for a laser diode, an automatic power control method for a laser diode, and a laser diode circuit.

BACKGROUND

Ranging with lasers is a mature technology, which generally includes the indirect time of flight (ITOF) method in which phase difference is measured and the direct time of flight (DTOF) method in which time is measured. The DTOF method detects the distance between a ranging device and an object by emitting a short pulse of light and then measuring the time it takes for the emitted light to return. Compared with the ITOF method, the transmitter of DTOF usually uses short pulse lasers of nanosecond or even picosecond level, and the detector needs to respond immediately at the moment of photon arrival. The DTOF method has the advantages of accurate measurement, fast response, low power consumption, and accurate synchronous detection of multiple objects. However, the DTOF method is also highly sensitive to temperature. That is, the DTOF method is easily affected by temperature. When the ambient temperature changes, the emission power of the ranging device will change with the temperature, thereby affecting the accuracy of DTOF ranging. For example, the internal resistance in the ranging device usually has a negative temperature coefficient. Under the same power supply, the internal resistance value is inversely proportional to the temperature, thereby the drive current flowing through the internal resistance is proportional to the temperature, which causes that the drive current gradually increases with the increasement of the temperature.

With respect to the unstable emission power caused by temperature, in the prior art, magnitude of the drive current is usually controlled to keep a constant emission power.

FIG. 1 illustrates a structural diagram of a laser head used for laser ranging in the prior art. As shown in FIG. 1, the laser head 100 includes a laser diode (LD) 101 and a photodiode (PD) 102. One end of the LD 101 and one end of the PD 102 share the same positive voltage, the other end of the PD 102 is connected to the driver manager 103, and the other end of the LD 101 is connected to the laser diode driver 104. Here, the LD 101 is used to emit laser, and the PD 102 detects the intensity of laser emitted by the LD 101. The stronger the laser emitted by the LD 101, the larger the current output by the PD 102, and the weaker the laser emitted by the LD 101, the smaller the current output by the PD 102. Changes in the current output by PD 102 cause changes in the output voltage of driver manager 103. This in turn effects the voltage of laser diode driver 104, which causes changes in the voltage drop across LD 101 and the current flowing through LD 101. For example, at 25° C., the emission power of the laser diode is 4 mW, and the required drive current of the laser diode is 20 mA, that is, the target value of the drive current is set to 20 mA. At 50° C., if the drive current of the laser diode is not adjusted, the emission power may be only 0.2 mW, which would lead to poor luminous efficiency. In this case, in order to still maintain the emission power at 4 mW, it is necessary to increase the target/setting value of the drive current of the laser diode to 24 mA. In order to change the target value/setting value of the drive current, it is necessary to change the circuit parameters of the drive circuit of the laser diode LD, which will lead changes of the optical properties of the laser emitted by the laser diode LD and complicate subsequent calculations. Furthermore, current DTOF methods generally comprise PD and further amplifiers, which further lead to complicated circuits and high costs.

SUMMARY

In order to solve the above technical problems, the aspects of the present disclosure provide an automatic power control circuit and method for a laser diode, and a laser diode circuit including the automatic power control circuit. The automatic power control circuit adaptively adjusts the pulse parameter of the laser pulses of the laser diode, which is used to set the total duration of pulses within a preset time period, according to the forward voltage of the laser diode in laser emitting state, so as to keep the emission power of laser within a preset range. In the automatic power control circuit, it's unnecessary to provide the photodiode PD, and the pulse parameter may be adjusted adaptively according to the change in temperature, so as to keep stable emission power without changing the setting value of the drive current of the laser diode.

According to an aspect of the present disclosure, there is provided an automatic power control circuit, comprising: a voltage measurement unit configured to obtain an indicative voltage at a specific measurement point and output the indicative voltage, wherein the indicative voltage is configured to indicate a forward voltage of a laser diode in laser emitting state; and a processor configured to output a pulse parameter control signal in response to the indicative voltage, wherein the pulse parameter control signal is used to control an adjustment for a pulse parameter of laser pulses of the laser diode, such that laser emission power is within a preset range, and wherein the pulse parameter of the laser pulses of the laser diode is used to set a total duration of pulses within a preset time period.

According to an aspect of the present disclosure, the automatic power control circuit further comprises a power control unit, which is connected to the processor and the laser diode, and is configured to adjust the pulse parameter of the laser pulses of the laser diode, according to the pulse parameter control signal output by the processor.

According to an aspect of the present disclosure, the pulse parameter of the laser pulses of the laser diode includes at least one of a number of pulses, a pulse period and a duty cycle.

According to an aspect of the present disclosure, in case that the pulse parameter includes the number of pulses, the processor is further configured to output the pulse parameter control signal for reducing the number of pulses, in response to an increase in the value of the forward voltage of the laser diode in laser emitting state.

According to an aspect of the present disclosure, in case that the pulse parameter includes the number of pulses, the processor is further configured to output the pulse parameter control signal for increasing the number of pulses, in response to a decrease in the value of the forward voltage of the laser diode in laser emitting state.

According to an aspect of the present disclosure, the total duration of the pulses is set by any one of the following: setting the number of pulses within the preset time period in the case of a preset pulse period and a preset duty cycle; and/or setting the pulse period and/or the duty cycle of the laser pulses within the preset time period in the case of a preset number of pulses.

According to an aspect of the present disclosure, during the preset time period, the pulse period and the duty cycle of the laser pulses are maintained, and the number of pulses is adjusted, such that a product of the total duration of pulses and an effective drive current is within a preset threshold interval, wherein the total duration of pulses is equal to a product of the number of pulses and a pulse duration of each laser pulse, and the effective drive current is equal to a difference between a drive current flowing through the laser diode and a threshold current of the laser diode.

According to an aspect of the present disclosure, the power control unit includes: a plurality of switches, one end of each of the plurality of switches being connected to a cathode of the laser diode, and another end of each switch being grounded; a drive current selection module configured to provide a plurality of current control outputs corresponding to the plurality of switches one-to-one, so as to control a magnitude of a current flowing through the laser diode; a pulse time control module configured to provide a plurality of time control outputs corresponding to the plurality of switches one-to-one, so as to control a duration of the laser diode in laser emitting state; and a logic gate module comprising a plurality of logic gates corresponding to the plurality of switches one-to-one, wherein each logic gate receives corresponding current control output and time control output to control the corresponding switch to be turned on or off.

According to an aspect of the present disclosure, the pulse time control module is configured to control a duration of at least one of the plurality of time control outputs being high or low, according to the pulse parameter control signal of the processor.

According to an aspect of the present disclosure, the plurality of time control outputs corresponding to the plurality of switches one-to-one provide a same time control output signal.

According to an aspect of the present disclosure, the processor is further configured to output a setting value of the drive current before the laser diode begins to emit the laser pulses, so as to control the drive current flowing through the laser diode; the drive current selection module is configured to control at least one of the plurality of current control outputs to be high or low, according to the setting value of drive current of the processor; the processor is further configured to keep the setting value of the drive current after the laser diode emits the laser pulses, and output the pulse parameter control signal; the pulse time control module is configured to control the duration of a time control output corresponding to the setting value of the drive current among the plurality of time control outputs being high or low, according to the pulse parameter control signal.

According to an aspect of the present disclosure, the voltage measurement unit includes an analog measurement portion and an analog to digital converter, wherein the analog measurement portion is connected to the specific measurement point and measures an analog voltage signal at the specific measurement point; and the analog to digital converter converts the analog voltage signal measured by the analog measurement portion into a digital voltage signal, and provides the digital voltage signal to the processor as the indicative voltage.

According to an aspect of the present disclosure, the analog measurement portion in the voltage measurement unit is connected to the cathode of the laser diode, and measures the analog voltage signal at the cathode of the laser diode; the analog to digital converter converts the analog voltage signal measured at the cathode of the laser diode into the digital voltage signal, and provides the digital voltage signal to the processor as the indicative voltage; the processor determines the forward voltage of the laser diode in laser emitting state based on the digital voltage signal.

According to an aspect of the present disclosure, the automatic power control circuit is not provided with a photodiode.

According to an aspect of the present disclosure, there is provided an automatic power control method comprising: obtaining an indicative voltage at a specific measurement point, wherein the indicative voltage is configured to indicate a forward voltage of a laser diode in laser emitting state; and outputting a pulse parameter control signal in response to the indicative voltage, wherein the pulse parameter control signal is used to control an adjustment for a pulse parameter of laser pulses of the laser diode, such that laser emission power is within a preset range, and wherein the pulse parameter of the laser pulses of the laser diode is used to set a total duration of pulses within a preset time period.

According to an aspect of the present disclosure, the pulse parameter includes at least one of a number of pulses, a pulse period and a duty cycle.

According to an aspect of the present disclosure, the total duration of the pulses is set by any one of the following: setting the number of pulses of the laser pulses within the preset time period in the case of a preset pulse period and a preset duty cycle; and/or setting the pulse period and the duty cycle of the laser pulses in the case of a preset number of pulses.

According to an aspect of the present disclosure, in case that the pulse parameter includes the number of pulses, the pulse parameter control signal for reducing the number of pulses is output in response to an increase in the value of the forward voltage.

According to an aspect of the present disclosure, in case that the pulse parameter includes the number of pulses, the pulse parameter control signal for increasing the number of pulses is output in response to a decrease in the value of the forward voltage.

According to an aspect of the present disclosure, the automatic power control method further comprises: outputting a setting value of the drive current before the laser diode begins to emit the laser pulses, so as to control the drive current flowing through the laser diode; and after the laser diode emits laser pulses, keeping the setting value of the drive current unchanged, and adjusting the pulse parameter of laser pulses of the laser diode in response to the indicative voltage, so as to set the total duration of pulses within the preset time period, such that the laser emission power is within the preset range.

According to an aspect of the present disclosure, there is provided a laser diode circuit, comprising: a laser diode configured to emit laser pulses; a voltage measurement unit configured to obtain an indicative voltage at a specific measurement point and output the indicative voltage, wherein the indicative voltage is configured to indicate a forward voltage of the laser diode in laser emitting state; and a processor configured to output a pulse parameter control signal in response to the indicative voltage, wherein the pulse parameter control signal is used to control an adjustment for a pulse parameter of laser pulses of the laser diode, such that a laser emission power is within a preset range, wherein the pulse parameter of the laser pulses of the laser diode is configured to set a total duration of pulses within a preset time period.

Through the automatic power control circuit and method, and the laser diode circuit of the present disclosure, it's unnecessary to provide the photodiode PD in the laser diode circuit, and the pulse parameter of the laser pulses of the laser diode may be adaptively adjusted according to the change in temperature, instead of directly adjusting the drive current of the laser diode as in the prior art, therefore the emission power may maintain stable conveniently and with low cost. These and other features and advantages are described in greater detail below.

BRIEF DESCRIPTION OF THE DRAWINGS

In order to explain the technical scheme of aspects of the present disclosure more clearly, the drawings needed in the description of one or more aspects herein will be briefly introduced below. Obviously, the drawings in the following description are only some exemplary aspects of the present disclosure. For those of ordinary skill in the art, other drawings may be obtained according to these drawings without any creative effort.

Here, in the drawings.

DETAILED DESCRIPTION

Figure 1:
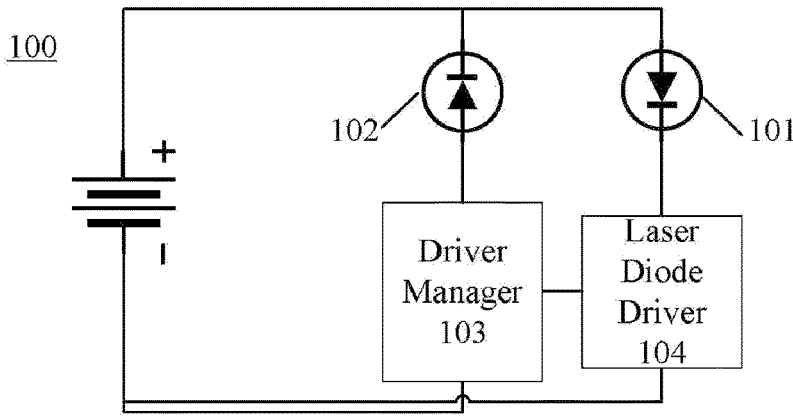
FIG. 1 is a diagram of the internal structure of a laser semiconductor head in the prior art.

In order to make the objectives, technical solutions and advantages of the aspects of the present disclosure more apparent, the technical solutions of the aspects of the present disclosure will be clearly and completely described below with reference to the accompanying drawings. Apparently, the described aspects are some, but not all, aspects of the present disclosure. Based on the aspects of the present disclosure described, all other aspects obtained by those of ordinary skilled in the art without creative efforts fall within the protection scope of the present disclosure.

Unless otherwise defined, technical or scientific terms used in this disclosure should have the ordinary meaning as understood by one of ordinary skilled in the art to which this disclosure belongs.

"A", "an" or "the" and similar words used in this disclosure also do not denote a limitation of quantity, but denote the presence of at least one. "Comprise" or "include" and similar words intend to mean that the elements or things appearing before the word encompass the elements or things recited after the word and their equivalents, but do not exclude other elements or things. "connection" or "connected" and similar words are not limited to physical or mechanical connection, but include electrical connection, regardless of direct or indirect connection.

At least one aspect of the present disclosure provides an automatic power control circuit for a laser diode, comprising: a voltage measurement unit configured to obtain an indicative voltage at a specific measurement point and output the indicative voltage to a processor, wherein the indicative voltage is configured to indicate a forward voltage of a laser diode in laser emitting state; and the processor configured to output a pulse parameter control signal in response to change in the indicative voltage, wherein the pulse parameter control signal is used to control an adjustment for a pulse parameter of laser pulses of the laser diode, such that laser emission power is within a preset range, and wherein the pulse parameter of the laser pulses of the laser diode is used to set a total duration of pulses within a preset time period.

At least one aspect of the present disclosure also provides an automatic power control method for a laser diode, comprising: obtaining an indicative voltage at a specific measurement point, wherein the indicative voltage is configured to indicate a forward voltage of a laser diode in laser emitting state; and outputting a pulse parameter control signal in response to the indicative voltage, wherein the pulse parameter control signal is used to control an adjustment for a pulse parameter of laser pulses of the laser diode, such that laser emission power is within a preset range, and wherein the pulse parameter of the laser pulses of the laser diode is used to set a total duration of pulses within a preset time period.

At least one aspect of the present disclosure also provides a laser diode circuit, comprising: a laser diode configured to emit laser pulses; a voltage measurement unit configured to obtain an indicative voltage at a specific measurement point and output the indicative voltage to a processor, wherein the indicative voltage is configured to indicate a forward voltage of the laser diode in laser emitting state; and the processor configured to output a pulse parameter control signal in response to the indicative voltage, wherein the pulse parameter control signal is used to control an adjustment for a pulse parameter of laser pulses of the laser diode, such that a laser emission power is within a preset range, wherein the pulse parameter of the laser pulses of the laser diode is configured to set a total duration of pulses within a preset time period.

By adopting the automatic power control circuit and method for laser diode, and the laser diode circuit comprising the automatic power control circuit of the present disclosure, it's unnecessary to provide a photodiode PD in the laser diode circuit, and the pulse parameter of laser pulses of laser diodes may be adaptively adjusted according to change in temperature, which has low cost and can maintain stable emission power without adjusting the setting value of the drive current of the laser diode in real time. That is, in operation, once the setting value of the drive current is set to control the drive current of the laser diode, even if the laser emission power of the laser diode changes, the setting value of the drive current is not adjusted, but only a total duration of the laser pulses of the laser diode in a preset time period is adjusted. By adjusting the total duration of the laser pulses of the laser diode in a preset time period and keeping the setting value of the drive current unchanged, the laser emission power of the laser diode can be stabilized.

Example automatic power control circuits and example methods, and example laser diode circuit according to aspects of the present disclosure will be described below in conjunction with FIGS. 2-5.

Figure 2:
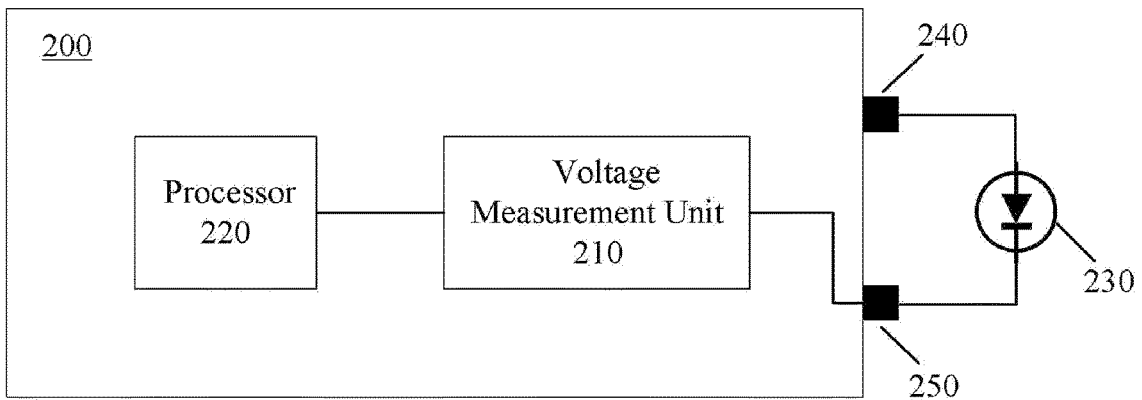
FIG. 2 is a diagram of an automatic power control circuit provided by at least one aspect of the present disclosure.

FIG. 2 illustrates a diagram of an automatic power control circuit for a laser diode provided according to aspects of the present disclosure.

As shown in FIG. 2, the automatic power control circuit 200 includes a voltage measurement unit 210 and a processor 220. In addition, the automatic power control circuit 200 also includes a power supply portion (not shown). The laser diode 230 is externally connected to the automatic power control circuit 200. The anode and cathode of the laser diode 230 are respectively connected to two different ports of the automatic power control circuit 200. The anode of the laser diode 230 is connected to the port 240 of the automatic power control circuit 200. The cathode of the diode 230 is connected to the port 250 of the automatic power control circuit 200. For example, power is supplied to the anode of the laser diode 230 by the power supply portion (not shown) of the automatic power control circuit 200.

The voltage measurement unit 210 obtains an indicative voltage at a specific measurement point, which is used to indicate the forward voltage of the laser diode 230 in laser emitting state, and outputs the indicative voltage to the processor 220. In this aspect, the specific measurement point may refer to the cathode of the laser diode 230, and the indicative voltage may refer to the voltage at the cathode of the laser diode 230, that is, the voltage at the port 250. Specifically, the voltage measurement unit 210 is connected to the cathode of the laser diode 230 and measures the voltage at the cathode of the laser diode 230. Then the processor 220 may determine the forward voltage of the laser diode 230 based on the voltage at the cathode of the laser diode 230. More particularly, the voltage supplied by the power supply portion of the automatic power control circuit 200 is constant, therefore the forward voltage of the laser diode 230 may be determined by measuring the voltage at the cathode of the laser diode 230 and subtracting the voltage at the cathode of the laser diode 230 from the voltage supplied by the power supply.

In this aspect, the voltage measurement unit 210 may measure the indicative voltage in real time, or measure the indicative voltage at a preset period, for example, measure the indicative voltage every 1 second. Moreover, in this aspect, the indicative voltage may be a digital voltage signal.

Alternatively, the voltage measurement unit 210 includes an analog measurement portion and an analog to digital converter (ADC). The analog measurement portion is connected to the specific measurement point and measures an analog voltage signal at the specific measurement point. For example, the voltage measurement unit 210 may be a connection wire, or may be a sensing resistor. The analog to digital converter converts the analog voltage signal measured by the analog measurement portion into a digital voltage signal, and provides the digital voltage signal to the processor as the indicative voltage. Specifically, the analog measurement portion measures the analog voltage signal at the port 250, and the analog to digital converter may convert the analog voltage signal at the port 250 into a digital voltage signal, which may be directly processed by the processor 220. For example, the analog to digital converter may be a 16-bit analog to digital converter that converts the measured analog voltage signal into a 16-bit digital voltage signal.

The processor 220 outputs a pulse parameter control signal in response to the change in the indicative voltage. The pulse parameter control signal is used to control an adjustment for the pulse parameter of the laser pulses of the laser diode 230, so as to keep the laser emission power within a preset range, wherein the pulse parameter of the laser pulses of the laser diode 230 is used to set the total duration of pulses within a preset time period. For example, the preset range may deviate from a given power by no more than 10%.

Alternatively, the processor 220 may be an electronic device with processing capability, such as a central processing unit (CPU), a single-chip microcomputer, or the like. For example, the processor in the aspects of the present disclosure may be an integrated circuit chip, a general-purpose processor, a digital signal processor (DSP), an application-specific integrated circuit (ASIC), a field programmable gate array (FPGA), or other programmable logic devices, discrete gate or transistor logic devices, discrete hardware components, which may implement or perform the methods, steps, and logic block diagrams disclosed in the aspects of this application. The general-purpose processor may be a microprocessor or the processor may be any conventional processor, etc., and may be of an X86 architecture or an ARM architecture.

In this aspect, the processor 220 may output a pulse parameter control signal to adjust the pulse parameter of the laser pulses of the laser diode 230 each time the indicative voltage is obtained from the voltage measurement unit 210. In another aspect, the processor 220 may temporarily save the indicative voltage obtained from the voltage measurement unit 210, and then determine whether the difference between the indicative voltage and the indicative voltage obtained when the laser diode 230 is initially controlled to emit laser exceeds a preset threshold. The pulse parameter control signal is output to adjust the pulse parameter of the laser pulses of the laser diode 230 once only when the difference exceeds the preset threshold.

In this aspect, the processor 220 may output a pulse parameter control signal, and control the laser emission of the laser diode 230 by controlling the connection between the laser diode 230 and the power supply portion according to the pulse parameter control signal. For example, a control switch may be provided between the port 240 of the laser diode 230 and the power supply portion, or a control switch may be provided between the port 250 of the laser diode 230 and the power supply portion, and the control switch may be controller based on the pulse parameter control signal output by the processor 220, such that the laser emission of the laser diode 230 is controlled.

Alternatively, the automatic power control circuit 200 further includes a memory (not shown). After measuring the indicative voltage, the voltage measurement unit 210 stores the indicative voltage in the memory. The processor 220 periodically obtains the latest indicative voltage from the memory, or the processor 220 obtains the latest indicative voltage from the memory in real-time. After obtaining the latest indicative voltage, the processor 220 generates a pulse parameter control signal according to the indicative voltage, so as to adjust the pulse parameter. For example, in the situation where the analog to digital converter is a 16-bit analog to digital converter, the memory may store the 16-bit digital signal output by the analog to digital converter.

Alternatively, the pulse parameter may include the number of pulses. In this aspect, the number of pulses refers to the number of pulses per second or in each pulse emission period, for example, there are 2000 pulses in 1 second. For example, the processor 220 is configured to determine the forward voltage of the laser diode in laser emitting state according to the indicative voltage, and output a pulse parameter control signal for reducing the number of pulses in response to an increase in the value of the determined forward voltage. For example, the value of the forward voltage determined by the processor 220 may be compared with the value of the initial forward voltage of the laser diode in laser emitting state. If the value of the determined forward voltage is greater than the value of the initial forward voltage, a pulse parameter control signal for reducing the number of pulses is output. For example, the processor 220 is further configured to output a pulse parameter control signal for increasing the number of pulses in response to a decrease in the value of the determined forward voltage. For example, the value of the forward voltage determined from the processor 220 may be compared with the value of the initial forward voltage of the laser diode in laser emitting state. If the value of the determined forward voltage is smaller than the value of the initial forward voltage, a pulse parameter control signal used to increase the number of pulses is output.

For example, the pulse parameter control signal may directly indicate the number of pulses. The processor 220 obtains a 16-bit digital voltage signal from the memory, and then calculates the number of pulses according to the digital voltage signal.

Figure 6:
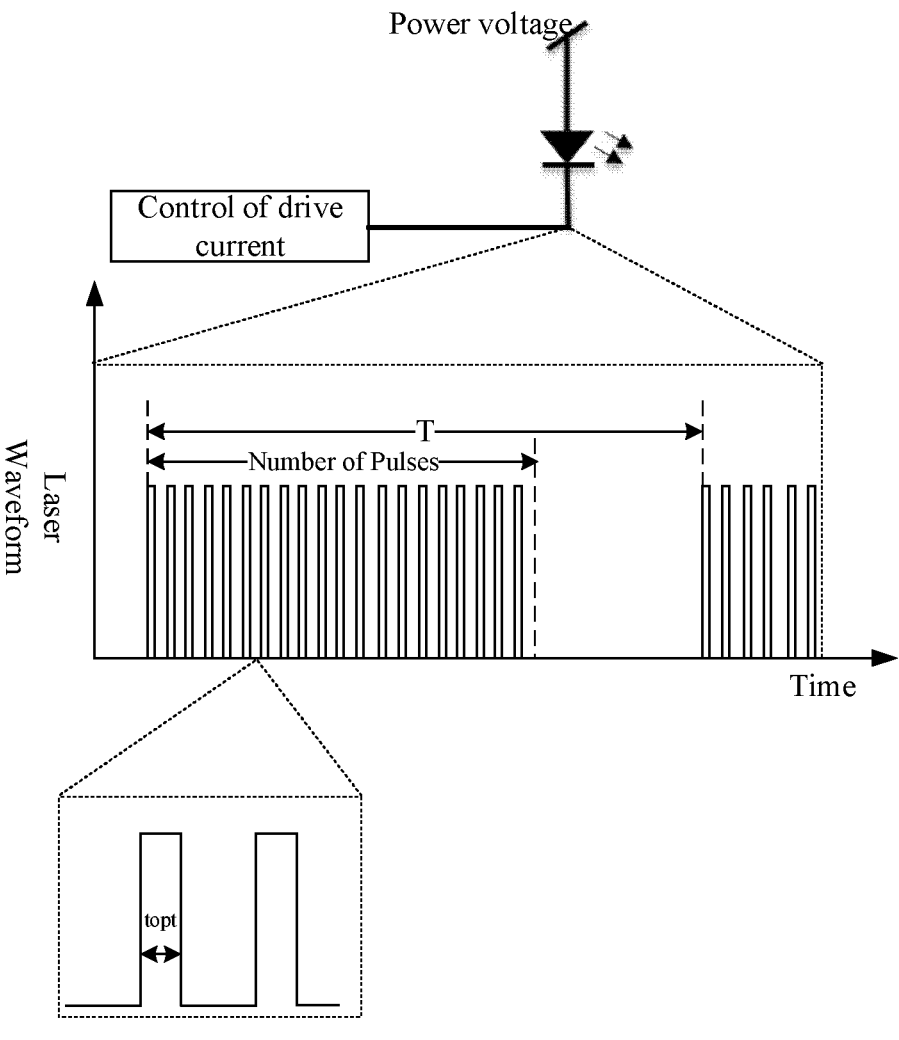
FIG. 6 is a diagram of a laser waveform of a laser diode provided by at least one aspect of the present disclosure.

As shown in FIG. 6, the laser waveform of the laser diode is illustrated, wherein T is the pulse emission period, the number of pulses emitted in a pulse emission period "Pulse, train" may be controlled, and topt is a pulse duration of a single pulse among multiple pulses in the pulse emission period.

Assuming that the laser pulse emitted by the laser diode 230 is ideal square wave, the relationship between the number of pulses and the drive current of the laser diode 230 may be expressed by the following equation:

$$(I\text{peak}-I\text{th})*\text{Pulse,train}*t\text{opt}*f=P\text{opt,avg}/\eta$$

Here, Ipeak is the peak value of the drive current, Ith is the threshold current at which the laser diode 230 can emit the laser pulse, "Pulse,train" is the number of pulses in one pulse emission period, f=1/T, T is the pulse emission period, η is the conversion efficiency of the laser pulse, and Popt,avg is the average optical power of the laser pulse in the pulse emission period.

It should be noted that, according to the aspect of the present disclosure, the pulse emission period represents a preset time period, during which pulses are periodically and continuously emitted, and each emitted pulse has the same pulse period/frequency.

Alternatively, the processor 220 may calculate the number of pulses in the pulse emission period according to the above equation. It may be understood that since the number of pulses is an integer, it is difficult to maintain the emission power of the laser diode 230 at a certain fixed value. Therefore, in the aspects of the present disclosure, the emission power is maintained within a preset emission power interval by adjusting the pulse parameter (e.g., the number of pulses). As such, not only the laser emission of the laser pulse may be ensured, but also the difficulty of implementation may be reduced effectively.

Alternatively, the pulse parameter of the laser pulses of the laser diode 230 includes at least one of the number of pulses, the pulse period of each pulse and/or the duty cycle of each pulse. By adjusting the pulse parameter, the total duration of pulses in a preset time period is adjusted, thereby the laser emission power of the laser diode 230 may be adjusted. For example, in the case where the value of the forward voltage of the laser diode 230 in laser emitting state increases, the processor 220 outputs a pulse parameter control signal for reducing the total duration of pulses; and in the case where the value of the forward voltage of the laser diode 230 in laser emitting state decreases, the processor 220 outputs a pulse parameter control signal for increasing the total duration of pulses. For example, the total duration of pulses may be set by any one of the following: setting the number of laser pulses in a preset time period in the case of a preset pulse period and a preset duty cycle; and setting the pulse period and/or duty cycle of laser pulse in the case of a preset number of pulses.

Further alternatively, during a preset time period, the pulse period and duty cycle of the laser pulse are maintained, and the number of pulses is adjusted, so that the product of the total duration of pulses and the effective drive current is maintained within the preset threshold interval, wherein the total duration of pulses is equal to the product of the number of pulses and the pulse duration of each laser pulse. For example, the preset time period is the pulse emission period T, and the effective drive current is equal to the difference between the drive current flowing through the laser diode and the threshold current at which the laser diode emits laser . . . .

According to aspects of the present disclosure, the automatic power control circuit 200 may not be provided with a photodiode. With the structure of the automatic power control circuit 200 in this aspect, devices such as a photodiode and an accessory amplifier may be omitted, thereby cost and circuit complexity may be reduced. However, it should be understood that the automatic power control circuit 200 may also be provided with a photodiode at the same time, and the intensity of laser emission detected by the photodiode may be used to assist or compensate the measurement results of the voltage measurement unit according to the aspect of the present disclosure.

Figure 3:
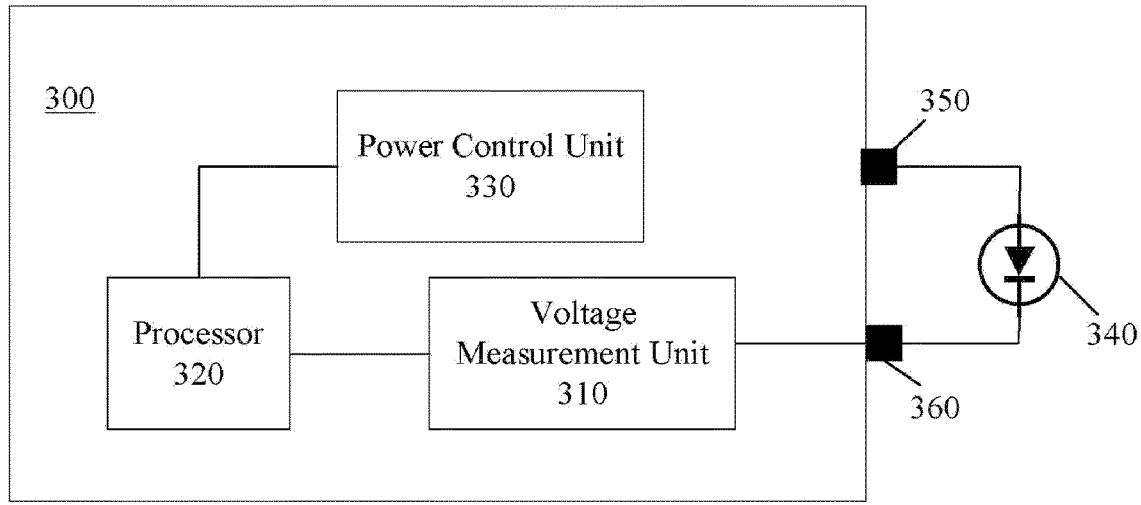
FIG. 3 is a diagram of another automatic power control circuit provided by at least one aspect of the present disclosure.

FIG. 3 illustrates a diagram of another automatic power control circuit provided according to aspects of the present disclosure.

In FIG. 3, the automatic power control circuit 300 includes a voltage measurement unit 310, a processor 320 and a power control unit 330, wherein the processor 320 is connected to the voltage measurement unit 310 and the power control unit 330. In addition, the automatic power control circuit 300 also includes a power supply portion (not shown). Similar to FIG. 2, the laser diode 340 is externally connected to the automatic power control circuit 300. The anode and the cathode of the laser diode 340 are respectively connected to two different ports of the automatic power control circuit 300. The anode of the laser diode 340 is connected to the port 350 of the automatic power control circuit 300, and the cathode of the laser diode 340 is connected to the port 360 of the automatic power control circuit 300. For example, power is supplied to the anode of the laser diode 340 by a power supply portion (not shown) of the automatic power control circuit 300.

The voltage measurement unit 310 obtains the indicative voltage at a specific measurement point, which is used to indicate the forward voltage of the laser diode 340 in laser emitting state. The voltage measurement unit 310 outputs the indicative voltage to the processor 320. In this aspect, the specific measurement point may refer to the cathode of the laser diode 230, and the indicative voltage may refer to the voltage at the cathode of the laser diode 340, that is, the voltage at the port 360. Specifically, the voltage measurement unit 310 is connected to the cathode of the laser diode 340 and measures the voltage at the cathode of the laser diode 340. Then the processor 320 may determine the forward voltage of the laser diode 340 in laser emitting state based on the voltage at the cathode of the laser diode 230. More particularly, the voltage supplied by the power supply portion of the automatic power control circuit 300 is constant, and the forward voltage of the laser diode 340 in laser emitting state may be determined by measuring the voltage at the cathode of the laser diode 340 and subtracting the voltage at the cathode of the laser diode 340 from the voltage supplied by the power supply portion.

In this aspect, the voltage measurement unit 310 may measure the indicative voltage in real time, or measure the indicative voltage at a preset period, for example, measure the indicative voltage every 1 second. Moreover, in this aspect, the indicative voltage may be a digital voltage signal.

Alternatively, the voltage measurement unit 310 includes an analog measurement portion and an analog to digital converter. The analog measurement portion is connected to the specific measurement point and measures an analog voltage signal at the specific measurement point. For example, the voltage measurement unit 310 may be a connecting wire, or may be a sensing resistor. The analog to digital converter converts the analog voltage signal measured by the analog measurement portion into a digital voltage signal, and provides the digital voltage signal to the processor 320 as the indicative voltage. For example, the analog measurement portion measures an analog voltage signal at port 360, and the analog to digital converter may convert the analog voltage signal at port 360 to a digital voltage signal that may be directly processed by processor 320. For example, the analog to digital converter may be a 16-bit analog to digital converter that converts the measured analog voltage signal into a 16-bit digital voltage signal.

In response to the change of the indicative voltage, the processor 320 outputs a pulse parameter control signal, which is used to control the adjustment for the pulse parameter of the laser pulses of the laser diode 340, such that the power of laser emission of the laser diode 340 is kept within a preset range, wherein the pulse parameter of the laser pulses of the laser diode 340 is used to set the total duration of pulses within a preset time period. For example, the preset range may deviate from a given power by no more than 10%.

Alternatively, the processor 320 may be an electronic device with processing capability, such as a central processing unit (CPU), a single-chip microcomputer, and the like. For example, the processor in the aspects of the present disclosure may be an integrated circuit chip, a general-purpose processor, a digital signal processor (DSP), an application-specific integrated circuit (ASIC), a field programmable gate array (FPGA), or other programmable logic devices, discrete gate or transistor logic devices, discrete hardware components, which may implement or perform the methods, steps, and logic block diagrams disclosed in the aspects of this application. The general-purpose processor may be a microprocessor or the processor may also be any conventional processor, etc., which may be of X86 architecture or ARM architecture.

In addition, as shown in FIG. 3, in this aspect, the power control unit 330 is connected to the processor 320. The processor 310 is configured to output the pulse parameter control signal to the power control unit 330 in response to a change in the value of the forward voltage of the laser diode 340 in laser emitting state. The power control unit 330 is configured to adjust the pulse parameter of the laser pulses of the laser diode 340 according to the pulse parameter control signal output by the processor 320.

In this aspect, the processor 320 may transmit the pulse parameter control signal to the power control unit 330 once every time the indicative voltage is obtained from the voltage measurement unit 310, so as to adjust the pulse parameter of the laser pulses, such that the power control unit 330 adjusts the pulse parameter of the laser pulses of the laser diode 340 once. In another implementation manner, the processor 320 may temporarily save the indicative voltage, and then determine whether the difference between the obtained indicative voltage and the initial indicative voltage exceeds a preset threshold value, where the initial indicative voltage is obtained when the laser diode 340 is initially controlled to emit laser. The pulse parameter control signal is transmitted to the power control unit 330 once to adjust the pulse parameter of the laser pulses only when the preset threshold is exceeded, so that the power control unit 330 may adjust the pulse parameter of the laser pulses of the laser diode 340 once.

In this aspect, the processor 320 may output a pulse parameter control signal, and the power control unit 330 may control the connection between the laser diode 230 and the power supply portion according to the pulse parameter control signal, thereby controlling the laser emission of the laser diode 340. For example, a control switch may be provided between the port 350 of the laser diode 340 and the power supply portion, or a control switch may be provided between the port 360 of the laser diode 340 and the power supply portion. The power control unit 330 may control the control switch based on the pulse parameter control signal, so as to control the laser emission of the laser diode 340. The control switch may be included within the power control unit 330, or may be independent from the power control unit 330.

Alternatively, the automatic power control circuit 300 further includes a memory (not shown). After measuring the indicative voltage, the voltage measurement unit 310 stores the indicative voltage in a memory. The processor 320 periodically obtains the latest indicative voltage value from the memory, or the processor 320 obtains the latest indicative voltage value from the memory in real time. After obtaining the latest value of the forward voltage, the processor 320 generates a pulse parameter control signal according to the indicative voltage, such that the power control unit 330 adjusts the pulse parameter. For example, in the case that the analog to digital converter may be a 16-bit analog to digital converter, the memory may store the 16-bit digital signal output by the analog to digital converter.

Alternatively, the pulse parameter may include the number of pulses. In this aspect, the number of pulses refers to the number of pulses per second or in each pulse emission period, for example, there are 2000 pulses in 1 second. For example, the processor 320 is configured to determine the forward voltage of the laser diode in laser emitting state according to the indicative voltage, and output a pulse parameter control signal for reducing the number of pulses in response to an increase in the value of the determined forward voltage. For example, the value of the forward voltage determined by the processor 320 may be compared with the value of the initial forward voltage. If the value of the determined forward voltage is greater than the value of the initial forward voltage, the pulse parameter control signal for reducing the number of pulses is output. For example, the processor 320 is further configured to output a pulse parameter control signal for increasing the number of pulses in response to a decrease in the value of the determined forward voltage. For example, the value of the forward voltage determined by the processor 320 may be compared with the value of the initial forward voltage. If the value of the determined forward voltage is less than the value of the initial forward voltage, the pulse parameter control signal for increasing the number of pulses is output. For example, the pulse parameter control signal may directly indicate the number of pulses, and the processor 320 obtains a 16-bit digital voltage signal from the memory, and then calculates the number of pulses according to the digital voltage signal.

Assuming that the laser pulses emitted by the laser diode 340 are ideal square waves, the relationship between the number of pulses and the drive current of the laser diode 340 may also be expressed by the following equation:

$$(I{\rm peak}-I{\rm th})*{\rm Pulse,train}*t{\rm opt}*f=P{\rm opt,avg}/\eta$$

Here, Ipeak is the peak value of the drive current, Ith is the threshold current at which the laser diode 340 emits the laser pulse, "Pulse, train" is the number of pulses in a pulse emission period, topt is the pulse duration of a single pulse among multiple pulses in the pulse emission period, f=1/T, T is the pulse emission period, η is the conversion efficiency of the laser pulse, "Popt, avg" is the average optical power of the laser pulses in the pulse emission period.

Alternatively, the pulse parameter of the laser pulses of the laser diode 340 includes at least one of the number of pulses, the pulse period and the duty cycle. By adjusting the pulse parameter, the total duration of pulses in a preset time period is adjusted, such that the laser emission power of the laser diode is adjusted. For example, in the case where the value of the forward voltage of the laser diode 340 increases, the processor 320 outputs a pulse parameter control signal for reducing the total duration of pulses; in the case where the value of the forward voltage of the laser diode 340 decreases, the processor 320 outputs a pulse parameter control signal for increasing the total duration of pulses.

For example, the total duration of pulses may be set by any one of the following: setting the number of laser pulses in a preset time period in the case of a preset pulse period and a preset duty cycle; and setting the pulse period and/or duty cycle of the laser pulse in the case of a preset number of pulses.

Further alternatively, within a preset time period, the pulse period and duty cycle of the laser pulse are maintained, and the number of pulses is adjusted, such that the product of the total duration of pulses and the effective drive current are kept within the preset threshold interval, wherein the total duration of pulses is equal to the product of the number of pulses and the pulse duration of each laser pulse, and the effective drive current is equal to the difference between the drive current flowing through the laser diode and the threshold current at which the laser diode emits the laser. For example, the preset time period is the pulse emission period T.

According to aspects of the present disclosure, the automatic power control circuit 300 may not be provided with a photodiode. With the structure of the automatic power control circuit 300 in this aspect, devices such as a photodiode and an accessory amplifier may be omitted, thereby cost and circuit complexity can be reduced. However, it should be understood that the automatic power control circuit 300 may also be provided with a photodiode at the same time, and the intensity of laser emission detected by the photodiode may be used to assist or compensate the measurement results of the voltage measurement unit according to the aspect of the present disclosure.

Figure 4:
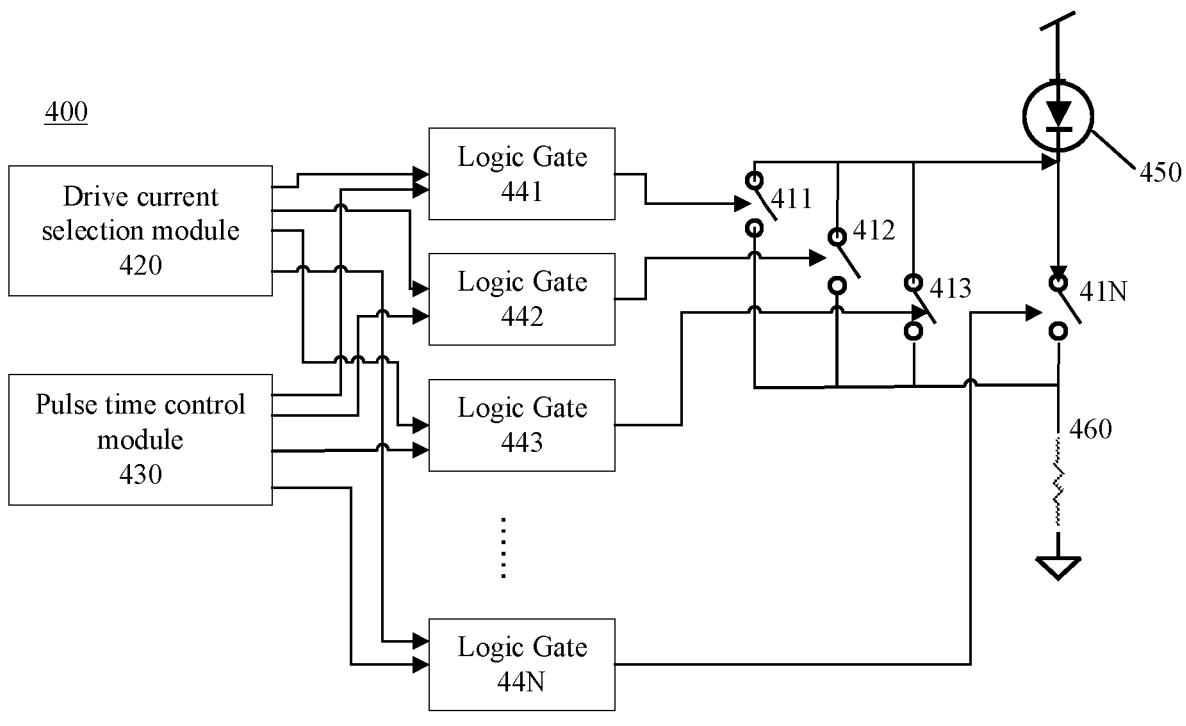
FIG. 4 is a diagram of a power control unit in an automatic power control circuit provided by at least one aspect of the present disclosure.

FIG. 4 illustrates a diagram of the power control unit 330 in the automatic power control circuit 300 according to aspects of the present disclosure.

As shown in FIG. 4, the power control unit 400 includes a plurality of switches, a drive current selection module 420, a pulse time control module 430 and a logic gate module. The power control unit 400 may be the power control unit 330 shown in FIG. 3.

The plurality of switches include switch 411, switch 412, . . . , switch 41N, wherein N is an integer greater than or equal to 2. One end of each of the plurality of switches is connected to the cathode of the laser diode 450, and the other end of each switch is grounded. For example, the plurality of switches may include 6 switches, each of which may be grounded via a common resistor 460 or be grounded via separate resistor. The laser diode 450 may be the laser diode 230 as shown in FIG. 2 or the laser diode 340 as shown in FIG. 3.

The drive current selection module 420 is configured to provide a plurality of current control outputs corresponding to the plurality of switches one-to-one, so as to control the magnitude of the current flowing through the laser diode 450. Alternatively, the drive current selection module 420 may receive a setting value of the drive current from the processor 320, and control at least one of the plurality of current control outputs to be a high level or a low level according to the setting value of the drive current.

The pulse time control module 430 is configured to provide a plurality of time control outputs corresponding to the plurality of switches one-to-one, so as to control the turn-on duration (i.e. light emitting duration) of the laser diode 450. Alternatively, the plurality of time control outputs corresponding to the plurality of switches one-to-one provide a same time control output signal, that is, the pulse time control module 430 provides the same time control output signal for the plurality of switches. Alternatively, the pulse time control module 430 receives the pulse parameter control signal from the processor 320, and controls a duration during which at least one of the plurality of time control outputs is high level or low level according to the pulse parameter control signal.

Alternatively, the magnitude of the drive current corresponding to each of the plurality of switches 411, 412, . . . 41N is different, and during the laser emission process, only one switch 411, 412, . . . 41N is turned on.

Alternatively, the magnitude of the drive current corresponding to each of the plurality of switches 411, 412, . . . 41N is the same or different, and during the laser emission process, at least one switch 411, 412, . . . 41N may be turned on.

The drive current selection module 420 together with the pulse time control module 430 control each of the plurality of switches to be turned on or off. For example, the greater the number of switches that are turned on, the greater the current (i.e., the drive current) that flows through the laser diode 450, and the greater the number of switches that are turned off, the lower the current that flows through the laser diode 450. Through controlling each of the switches being turned on or off by the outputs of the drive current selection module 420 together with the pulse time control module 430, more accurate control of the switches may be realized, and the issue in which the switches cannot be normally turned on or off due to the failure of a single device may be prevented, such that the laser diode 450 may be better driven.

The logic gate module includes a plurality of logic gates corresponding to the plurality of switches one-to-one, and each logic gate receives corresponding current control output and time control output to control the corresponding switch to be turned on or off. The plurality of logic gates include the logic gate 441, the logic gate 442, . . . , and the logic gate 44N, where N is an integer greater than or equal to 2. The logic gate 441 is connected to the switch 411, the logic gate 442 is connected to the switch 412, . . . , and the logic gate 44N is connected to the switch 41N. In this aspect, the number of multiple logic gates is equal to the number of multiple switches. For example, if there are 8 switches, there are 8 logic gates. Each of the plurality of switches may be implemented by a transistor. Each logic gate in the logic gate module may be an AND gate, a NOR gate, an XOR gate, or an OR gate. For example, if each logic gate in the logic gate module is an AND gate, the logic gate outputs "high level" or "1" when the current control output of the drive current selection module 420 and the time control output of the pulse time control module 430 are both "high level" or "1", such that the corresponding switch is controlled to be turned on. For another example, if each logic gate in the logic gate module 440 is a NOR gate, the logic gate outputs "high level" or "1" when the current control output of the drive current selection module 420 and the time control output of the pulse time control module 430 are both "low level" or "0", such that corresponding switch is controlled to be turned on.

Alternatively, the processor 320 is further configured to output a setting value of the drive current to control the drive current flowing through the laser diode 450 before the laser diode 450 begins to emit a laser pulse. The drive current selection module 420 is configured to control at least one of the plurality of current control outputs to be a high level or a low level according to the setting value of the drive current. For example, the setting value of the drive current may include the number of current control outputs which output a high level, thereby the drive current selection module 420 selects a corresponding number of current control outputs, such as four, according to the number. The drive current selection module 420 may arbitrarily select the multiple current control outputs, for example, in a numbered order, randomly, or in turn. For another example, the setting value of the drive current may include a preset magnitude/preset level of the drive current, and the drive current selection module 420 selects at least one from among the multiple current control outputs according to the corresponding relationship between the preset magnitude/preset level and the multiple current control outputs.

Alternatively, the processor 320 is further configured to keep the setting value of the drive current unchanged after the laser diode 450 emits a laser pulse, and output the pulse parameter control signal, so as to control the duration of the time control output corresponding to the setting value of the drive current among the plurality of time control outputs being high or low. The pulse time control module 430 is configured to control, according to the pulse parameter control signal, the duration of the time control output corresponding to the set drive current among the plurality of time control outputs being high or low. For example, the pulse parameter control signal may indicate the number of pulses, and the pulse time control module 430 outputs the time control output signal according to the number of pulses indicated by the pulse parameter control signal, as well as the preset pulse period and duty cycle, so as to control the total duration of laser pulses of the laser diode without changing the setting value of the drive current.

In this aspect, before the laser diode 450 begins to emit laser pulses each time, the processor 320 may output the setting value of the drive current to the power control unit 400, thereby setting the initial drive current of the laser diode 450 through the power control unit 400. Here, "the laser diode 450 begins to emit laser pulses each time" means that the initial drive current is set once when the laser diode 450 is initialized, or when the laser emission properties of the laser diode 450 need to be changed. For example, each time the laser diode 450 is calibrated/initialized, or the working mode or working level of the laser diode 450 is reset, the initial drive current will be set and will correspond to the above initial forward voltage in laser emitting state.

In addition, according to aspects of the present disclosure, a laser diode circuit is also provided. The laser diode circuit includes: a laser diode configured to emit laser pulses; a voltage measurement unit configured to obtain an indicative voltage at a specific measurement point and output the indicative voltage, the indicative voltage being configured to indicate a forward voltage of the laser diode in laser emitting state; and a processor configured to output a pulse parameter control signal in response to the indicative voltage, the pulse parameter control signal is used to control an adjustment for pulse parameter of the laser pulses of the laser diode, such that the laser emission power is within a preset range, wherein the pulse parameter of the laser pulses of the laser diode is used to set the total duration of pulses within a preset time period.

As shown in FIG. 2, the laser diode circuit according to aspects of the present disclosure includes a laser diode 230 configured to emit laser pulses; a voltage measurement unit 210 configured to obtain an indicative voltage at a specific measurement point and output the indicative voltage, the indicative voltage being configured to indicate the forward voltage of the laser diode in laser emitting state; and the processor 220 configured to output a pulse parameter control signal in response to the indicative voltage, the pulse parameter control signal is used to control an adjustment for pulse parameter of the laser pulses of the laser diode, such that the laser emission power is within a preset range, wherein the pulse parameter of the laser pulse of the laser diode is used to set the total duration of pulses within a preset time period.

As shown in FIG. 3, the laser diode circuit according to aspects of the present disclosure includes a laser diode 340 configured to emit laser pulses; a voltage measurement unit 310 configured to obtain an indicative voltage at a specific measurement point and output the indicative voltage, the indicative voltage being configured to indicate the forward voltage of the laser diode in laser emitting state; and the processor 320 configured to output a pulse parameter control signal in response to the indicative voltage, the pulse parameter control signal is used to control an adjustment for pulse parameter of the laser pulses of the laser diode 340, such that the laser emission power is within a preset range, wherein the pulse parameter of the laser pulse of the laser diode 340 is used to set the total duration of pulses within a preset time period.

According to aspects of the present disclosure, the laser diode circuit may further include: a power control unit 330 connected to the processor 320 and the laser diode 340 and configured to adjust the pulse parameter of the laser pulses of the laser diode 340 according to the pulse parameter control signal output by the processor 320.

For operations of the voltage measurement unit 210/310, the processor 220/320, and the power control unit 330 included in the laser diode circuit according to the aspect of the present disclosure, reference may be made to the operations of the voltage measurement unit 210/310, the processor 220/320, and the power control unit 330 included in the automatic power control circuit according to the aspect of the present disclosure, and repeated description will be omitted here.

Figure 5:
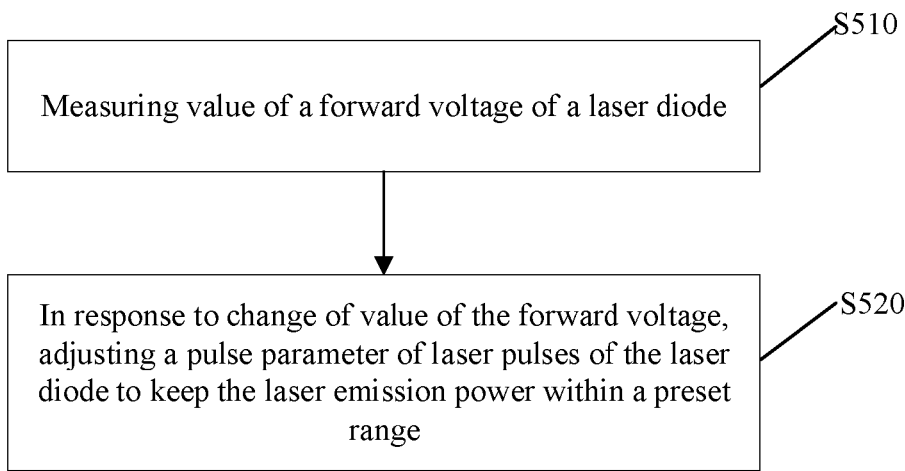
FIG. 5 is a flowchart of an automatic power control method provided by at least one aspect of the present disclosure.

FIG. 5 illustrates a flowchart of an automatic power control method provided according to aspects of the present disclosure.

As shown in FIG. 5, the automatic power control method 500 includes the following steps:

Step S510, obtaining the indicative voltage at a specific measurement point, wherein the indicative voltage is used to indicate the forward voltage of the laser diode in laser emitting state.

Step S520, outputting a pulse parameter control signal in response to the indicative voltage, the pulse parameter control signal is used to control the adjustment for the pulse parameter of the laser pulses of the laser diode such that the laser emission power is within a preset range, wherein the pulse parameter of the laser pulses of the laser diode is used to set the total duration of the pulses within a preset time period.

The automatic power control method 500 in this aspect may be performed by a processor, e.g., the processor 220 and the processor 320 described above. The processor executes the automatic power control method, thereby the pulse parameter of the laser diode may be adjusted adaptively in real-time according to change in temperature, rather than the emission power is adjusted directly by adjusting the setting value of the drive current of the laser diode as in the prior art. Further, it is not necessary for the circuit in which the automatic control method according to the aspects is performed by the processor to be provided with a photodiode and additional amplifiers, and thus the cost may also be reduced.

Alternatively, the pulse parameter of the laser pulses of the laser diode 230 includes at least one of the number of pulses, the pulse period and the duty cycle. By adjusting the pulse parameter, the total duration of pulses in a preset time period is adjusted, therefore the laser emission power of the laser diode is adjusted. For example, in the case that the value of the forward voltage of the laser diode 230 in laser emitting state increases, a pulse parameter control signal for reducing the total duration of pulses is output; in the case that the value of the forward voltage of the laser diode 230 in laser emitting state decreases, a pulse parameter control signal for increasing the total duration of pulses is output. For example, the total duration of pulses may be set by any of the following: setting the number of laser pulses in a preset time period in the case of a preset pulse period and a preset duty cycle; and setting pulse period and/or duty cycle of the laser pulse in the case of a preset number of pulses.

Alternatively, the pulse parameter may include the number of pulses. In this aspect, the number of pulses refers to the number of pulses per second or in each pulse emission period, for example, there are 2000 pulses in 1 second. For example, the processor 220 is configured to determine the forward voltage of the laser diode in laser emitting state according to the indicative voltage, and output a pulse parameter control signal for reducing the number of pulses in response to an increase in the value of the determined forward voltage. The value of the forward voltage determined by the processor 220 may be compared with the value of the initial forward voltage of the laser diode in laser emitting state. If the value of the determined forward voltage is greater than the value of the initial forward voltage, the pulse parameter control signal for reducing the number of pulses is output. For example, the processor 220 is further configured to output a pulse parameter control signal for increasing the number of pulses in response to a decrease in the value of the forward voltage in laser emitting state. The value of the forward voltage determined by the processor 220 may be compared with the value of the initial forward voltage of the laser diode in laser emitting state. If the value of the determined forward voltage is smaller than the value of the initial forward voltage, the pulse parameter control signal for increasing the number of pulses is output.

Alternatively, the automatic power control method further outputs a setting value of the drive current before the laser diode begins to emit laser pulses, so as to control the drive current flowing through the laser diode. Further, after the laser diode emits the laser pulse, the setting value of the drive current is kept. In response to the change of the value of the forward voltage, the pulse parameter control signal is generated to adjust the pulse parameter of the laser pulses of the laser diode, so as to keep the laser emission power within the preset range. The pulse parameter is used to set the total duration of pulses within a preset time period.

According to the method in this aspect, it's unnecessary to provide a photodiode in the automatic power control circuit, and the current of the photodiode does not need to be monitored as in the prior art, and the setting value of the drive current of the laser diode does not need to be changed. The method may adjust self-adaptively the emission power of the laser diode by setting the pulse parameter of the laser diode, rather than changing the laser emission properties of the laser diode, which is simple and easy to be implemented.

In general, the various example aspects of the present disclosure may be implemented in hardware or special purpose circuits, software, firmware, logic, or any combination thereof. Certain aspects may be implemented in hardware, while other aspects may be implemented in firmware or software that may be executed by a controller, microprocessor or other computing device. While aspects of the aspects of the present disclosure are illustrated or described as block diagrams, flowcharts, or some other graphical representation, it is to be understood that the blocks, apparatus, systems, techniques, or methods described herein may be implemented as non-limiting examples in hardware, software, firmware, special purpose circuits or logic, general purpose hardware or controllers or other computing devices, or certain combination thereof.

Memory in aspects of the present disclosure may be volatile memory or non-volatile memory, or may include both volatile and non-volatile memory. Non-volatile memory may be read only memory (ROM), programmable read only memory (PROM), erasable programmable read only memory (EPROM), electrically erasable programmable read only memory (EEPROM), or flash memory. Volatile memory may be random access memory (RAM), which acts as an external cache. By way of example and not limitation, RAMs in many forms are available, for example, static random access memory (SRAM), dynamic random access memory (DRAM), synchronous dynamic random access memory (SDRAM), double data rate synchronous dynamic Random Access Memory (DDRSDRAM), Enhanced Synchronous Dynamic Random Access Memory (ESDRAM), Synchronous Link Dynamic Random Access Memory (SLDRAM), and Direct Memory Bus Random Access Memory (DR RAM). It should be noted that the memory of the methods described herein is intended to include, but not be limited to, these and any other suitable types of memory. It should be noted that the memory of the methods described herein is intended to include, but not be limited to, these and any other suitable types of memory.

It should be noted that the flowcharts and block diagrams in the drawings illustrate the architecture, functionality, and operation of possible implementations of systems, methods and computer program products according to various aspects of the present disclosure. In this regard, each block in the flowchart or block diagrams may represent a module, program segment, or portion of code, which includes at least one executable instruction for implementing the specified logical function. It should also be noted that, in some alternative implementations, the functions noted in the blocks may occur in the order different from that in the drawings. For example, two blocks shown in succession may, in fact, be executed substantially concurrently, or the blocks may sometimes be executed in the reverse order, depending upon the functionality involved. It is also noted that each block of the block diagram and/or flowchart, and combinations of blocks in the block diagram and/or flowchart, may be implemented in dedicated hardware-based systems that perform the specified functions or operations, or may be implemented in a combination of dedicated hardware and computer instructions.

In general, the various example aspects of the present disclosure may be implemented in hardware or special purpose circuits, software, firmware, logic, or any combination thereof. Certain aspects may be implemented in hardware, while other aspects may be implemented in firmware or software that may be executed by a controller, microprocessor or other computing device. While aspects of the aspects of the present disclosure are illustrated or described as block diagrams, flowcharts, or some other graphical representation, it is to be understood that the blocks, apparatus, systems, techniques, or methods described herein may be implemented as non-limiting examples in hardware, software, firmware, special purpose circuits or logic, general purpose hardware or controllers or other computing devices, or certain combination thereof.

The example aspects of the present disclosure described in detail above are illustrative only and not restrictive. It should be understood by those skilled in the art that various modifications and combinations may be made on the aspects or features thereof without departing from the principles and spirit of the present disclosure, and such modifications are intended to fall within the scope of the present disclosure.

What is claimed is:

1. An automatic power control circuit, comprising:
a voltage measurement unit configured to obtain an indicative voltage at a specific measurement point and output the indicative voltage, wherein the indicative voltage is configured to indicate a forward voltage of a laser diode in laser emitting state; and
a processor configured to output a pulse parameter control signal in response to the indicative voltage, wherein the pulse parameter control signal is used to control an adjustment for a pulse parameter of laser pulses of the laser diode while keeping a setting value of a drive current flowing through the laser diode unchanged, such that laser emission power is within a preset range, and wherein the pulse parameter of the laser pulses of the laser diode is used to set a total duration of pulses within a preset time period.

2. The automatic power control circuit of claim 1, further comprising:
a power control unit connected to the processor and the laser diode and configured to adjust the pulse parameter of the laser pulses of the laser diode according to the pulse parameter control signal output by the processor.

3. The automatic power control circuit of claim 2, wherein the power control unit comprises:
a plurality of switches, one end of each of the plurality of switches being connected to a cathode of the laser diode, and another end of each switch being grounded;
a drive current selection module configured to provide a plurality of current control outputs corresponding to the plurality of switches one-to-one, so as to control a magnitude of a current flowing through the laser diode;
a pulse time control module configured to provide a plurality of time control outputs corresponding to the plurality of switches one-to-one, so as to control a duration of the laser diode in laser emitting state; and
a logic gate module comprising a plurality of logic gates corresponding to the plurality of switches one-to-one, wherein each logic gate receives corresponding current control output and time control output to control the corresponding switch to be turned on or off.

4. The automatic power control circuit of claim 3, wherein the pulse time control module is configured to control a duration of at least one of the plurality of time control outputs being high or low, according to the pulse parameter control signal of the processor.

5. The automatic power control circuit of claim 3, wherein the plurality of time control outputs corresponding to the plurality of switches one-to-one provide a same time control output signal.

6. The automatic power control circuit of claim 3, wherein
the processor is further configured to output the setting value of the drive current before the laser diode begins to emit the laser pulses, so as to control the drive current flowing through the laser diode;
the drive current selection module is configured to control at least one of the plurality of current control outputs to be high or low, according to the setting value of the drive current of the processor;
the processor is further configured to keep the setting value of the drive current after the laser diode emits the laser pulses, and output the pulse parameter control signal; and
the pulse time control module is configured to control the duration of a time control output corresponding to the setting value of the drive current among the plurality of time control outputs being high or low, according to the pulse parameter control signal.

7. The automatic power control circuit of claim 1, wherein the pulse parameter of the laser pulses of the laser diode includes at least one of a number of pulses, a pulse period and a duty cycle.

8. The automatic power control circuit of claim 7, wherein in a case that the pulse parameter includes the number of pulses,
the processor is further configured to output the pulse parameter control signal for reducing the number of pulses in response to an increase in a value of the forward voltage of the laser diode in laser emitting state.

9. The automatic power control circuit of claim 7, wherein in a case that the pulse parameter includes the number of pulses,
the processor is further configured to output the pulse parameter control signal for increasing the number of pulses in response to a decrease in a value of the forward voltage of the laser diode in laser emitting state.

10. The automatic power control circuit of claim 7, wherein the total duration of the pulses is set by any one of the following:

setting the number of pulses within the preset time period in a case of a preset pulse period and a preset duty cycle; and/or setting the pulse period and/or the duty cycle of the laser pulses within the preset time period in a case of a preset number of pulses.

11. The automatic power control circuit of claim 10, wherein during the preset time period, the pulse period and the duty cycle of the laser pulses are maintained, and the number of pulses is adjusted, such that a product of the total duration of pulses and an effective drive current is within a preset threshold interval, wherein the total duration of pulses is equal to a product of the number of pulses and a pulse duration of each laser pulse, and the effective drive current is equal to a difference between the drive current flowing through the laser diode and a threshold current of the laser diode.

12. The automatic power control circuit of claim 1, wherein the voltage measurement unit includes an analog measurement portion and an analog to digital converter, wherein the analog measurement portion is connected to the specific measurement point and measures an analog voltage signal at the specific measurement point; and the analog to digital converter converts the analog voltage signal measured by the analog measurement portion into a digital voltage signal, and provides the digital voltage signal to the processor as the indicative voltage.

13. The automatic power control circuit of claim 12, wherein the analog measurement portion in the voltage measurement unit is connected to a cathode of the laser diode, and measures the analog voltage signal at the cathode of the laser diode;

the analog to digital converter converts the analog voltage signal measured at the cathode of the laser diode into the digital voltage signal, and provides the digital voltage signal to the processor as the indicative voltage; and the processor determines the forward voltage of the laser diode in laser emitting state based on the digital voltage signal.

14. The automatic power control circuit of claim 1, wherein the automatic power control circuit is not provided with a photodiode.

15. An automatic power control method, comprising:

obtaining an indicative voltage at a specific measurement point, wherein the indicative voltage is configured to indicate a forward voltage of a laser diode in laser emitting state; and outputting a pulse parameter control signal in response to the indicative voltage, wherein the pulse parameter control signal is used to control an adjustment for a pulse parameter of laser pulses of the laser diode while keeping a setting value of a drive current flowing through the laser diode unchanged, such that laser emission power is within a preset range, and wherein the pulse parameter of the laser pulses of the laser diode is used to set a total duration of pulses within a preset time period.

16. The automatic power control method of claim 15, wherein the pulse parameter includes at least one of a number of pulses, a pulse period and a duty cycle.

17. The automatic power control method of claim 16, wherein the total duration of the pulses is set by any one of the following:

setting the number of pulses of the laser pulses within the preset time period in a case of a preset pulse period and a preset duty cycle; and/or setting the pulse period and the duty cycle of the laser pulses in a case of a preset number of pulses.

18. The automatic power control method of claim 15, wherein in a case that the pulse parameter includes a number of pulses, the pulse parameter control signal for reducing the number of pulses is output in response to an increase in a value of the forward voltage.

19. The automatic power control method of claim 15, wherein in a case that the pulse parameter includes a number of pulses, the pulse parameter control signal for increasing the number of pulses is output in response to a decrease in a value of the forward voltage.

20. The automatic power control method of claim 15, further comprising:

outputting the setting value of the drive current before the laser diode begins to emit the laser pulses, so as to control the drive current flowing through the laser diode; and after the laser diode emits laser pulses, keeping the setting value of the drive current unchanged, and adjusting the pulse parameter of laser pulses of the laser diode in response to the indicative voltage, so as to set the total duration of pulses within the preset time period.

21. A laser diode circuit, comprising:

a laser diode configured to emit laser pulses;

a voltage measurement unit configured to obtain an indicative voltage at a specific measurement point and output the indicative voltage, wherein the indicative voltage is configured to indicate a forward voltage of the laser diode in laser emitting state; and a processor configured to output a pulse parameter control signal in response to the indicative voltage, wherein the pulse parameter control signal is used to control an adjustment for a pulse parameter of laser pulses of the laser diode while keeping a setting value of a drive current flowing through the laser diode unchanged, such that a laser emission power is within a preset range, wherein the pulse parameter of the laser pulses of the laser diode is configured to set a total duration of pulses within a preset time period.

\* \* \* \* \*